United States Patent [19]

Osanai

[11] Patent Number: 5,524,502
[45] Date of Patent: Jun. 11, 1996

[54] POSITIONING APPARATUS INCLUDING A HYDROSTATIC BEARING FOR SPACING APART A SUPPORTING SURFACE AND A GUIDE SURFACE

[75] Inventor: Eiji Osanai, Yokohama, Japan

[73] Assignee: Canon Kabushiki Kaisha, Tokyo, Japan

[21] Appl. No.: 204,437

[22] Filed: Mar. 2, 1994

[30] Foreign Application Priority Data

Mar. 11, 1993 [JP] Japan ................... 5-077737

[51] Int. Cl.⁶ ................... H01L 21/68; B23Q 16/00
[52] U.S. Cl. ................... 74/490.07; 108/20; 108/141; 384/113; 384/279; 384/902; 74/490.08
[58] Field of Search ................... 74/479.01, 490.07, 74/490.08, 490.09, 490.1; 108/20, 138, 141; 384/113, 115, 124, 144, 279, 902; 248/664, 913

[56] References Cited

U.S. PATENT DOCUMENTS

| | | | |
|---|---|---|---|
| 4,006,645 | 2/1977 | Newell | 74/490.08 |
| 4,656,951 | 4/1987 | Kimura et al. | 108/20 |
| 5,040,431 | 8/1991 | Sakino et al. | 74/479 |
| 5,163,651 | 11/1992 | Matsumoto | 108/20 X |
| 5,239,892 | 8/1993 | Sakai | 108/20 X |
| 5,280,677 | 1/1994 | Kubo et al. | 33/568 |

*Primary Examiner*—Richard M. Lorence
*Attorney, Agent, or Firm*—Fitzpatrick, Cella, Harper & Scinto

[57] ABSTRACT

A base board supported on an X–Y stage or the like of an exposure apparatus includes a cylindrical fixed member. Porous pads held on the fixed member support the inner circumferential surface of a guide member provided as one body with a holding member for holding a wafer in a non-contact state. The base board is rotated around its central axis by a θ linear motor, and is reciprocated in the vertical direction by Z linear motors provided at an equal interval in the circumferential direction. Each of the Z linear motors and the θ linear motor includes a rotor fixed to the holding board, and a stator that includes a coil fixed to the base board.

9 Claims, 5 Drawing Sheets

POSITIONING APPARATUS INCLUDING A HYDROSTATIC BEARING FOR SPACING APART A SUPPORTING SURFACE AND A GUIDE SURFACE

BACKGROUND OF THE INVENTION

1. Field of the Invention

This invention relates to a positioning apparatus which is used for projection exposure apparatuses used in semiconductor lithography, various kinds of precision processing machines, various kinds of precision measuring apparatuses, or the like.

2. Description of the Related Art

In projection exposure apparatuses used in semiconductor lithography, various kinds of precision processing machines, various kinds of precision measuring apparatuses, or the like, positioning of a substrate to be exposed, such as a wafer or the like, an object to be processed or an object to be measured with high precision, is required. In addition, recently, high-speed positioning is desired in order to improve the throughput of the operation.

FIGS. 8 and 9 are a plan view and a cross-sectional view, respectively, of a conventional top stage for performing focusing or final fine positioning of a substrate, such as a wafer or the like, with respect to a projection lens system in a projection exposure apparatus. Top stage $E_0$ includes a circular holding board 104 having a suction surface (not shown) for attracting a substrate, such as a wafer or the like, by a vacuum suction force or the like. Holding board 104 is supported by a plurality of first piezoelectric elements 105 on top plate 101 of an XY stage (not shown). One end of each of the first piezoelectric elements 105 is elastically connected to annular member 103 adjacent to the outer circumference of holding board 104 via an elastic hinge 105a. Another end of each of the first piezoelectric elements 105 is elastically connected to top plate 101 via an elastic hinge 105b. Holding board 104 and annular member 103 are elastically connected by a plurality of first leaf springs 103a. A plurality of supporting members 102 provided as one body with top plate 101 and the outer circumference of annular member 103 are elastically connected by a plurality of second leaf springs 103b.

First piezoelectric elements 105 expand and contract by driving currents individually supplied to the respective elements, so as to bring holding board 104 away from and closer to top plate 101, and to change the relative angle of inclination between holding board 104 and top plate 101. Holding board 104 has a protruding arm 104a extending in the direction of its diameter through an opening 103c of annular member 103. A second piezoelectric element 106 is provided between the protruding arm 104a and a protruding arm 103d provided on annular member 103. Holding board 104 and annular member 103 retatively rotate by the expansion and contraction of piezoelectric element 106.

That is, by driving all of the first piezoelectric elements 105 by the same amount, holding board 104 is reciprocated about an axis perpendicular to the surface of top plate 101 (hereinafter termed a "z axis"), and by individually changing the driving amount for each of the first piezoelectric elements 105, the angle of inclination of holding board 104 with respect to the plane perpendicular to the z axis, i.e., the parallelism of holding board 104, is adjusted. Furthermore, by driving the second piezoelectric element 106, the angle of rotation of holding board 104 around the z axis is adjusted.

Focusing and final positioning of a wafer (not shown) held on holding board 104 are performed by such fine adjustment.

However, in the above-described conventional approach, since the second piezoelectric element is connected to the annular member, which is moved by the first piezoelectric elements, a large amount of unbalance is produced in the mass of the annular member. In addition, oscillations generated when simultaneously driving the first and second piezoelectric elements mutually influence the stability of those elements, thereby causing a great decrease in dynamic characteristics as well as a decrease in the positioning accuracy. Accordingly, the speed of positioning using the top stage cannot be increased.

Furthermore, since the annular member and the holding board, and the supporting members, provided as one body with the top plate, and the annular member are connected by leaf springs, the annular member and/or the supporting members may deform by the reaction of the leaf springs when the amount of driving of each of the piezoelectric elements is large, thereby causing a decrease in the positioning accuracy.

SUMMARY OF THE INVENTION

The present invention has been made in consideration of the above-described problems.

It is an object of the present invention to provide a positioning apparatus, in which high-speed positioning is easily performed because there is no possibility of generating a large amount of oscillation during driving, and there is no possibility of reducing accuracy in positioning even if the amount of driving is large.

According to one aspect, the present invention which achieves the above-described object relates to a positioning apparatus comprising supporting means mounted on a base board, a holding board having a guide surface facing a supporting surface of the supporting means, hydrostatic bearing means for spacing apart the supporting surface of the supporting means and the guide surface of said holding board such that they do not contact each other, first driving means for moving the holding board along the supporting surface of the supporting means, and second driving means for rotating the holding board around an axis that is parallel to the supporting surface of the supporting means.

The guide surface may be the inner circumferential surface or the outer circumferential surface of a cylindrical guide member provided as a unit with the holding board.

The first driving means may comprise at least three driving devices connected to different portions in the circumferential direction of the holding board.

Positioning of the holding board in the axial direction and in the direction of rotation is performed by the first and second driving means, respectively. Since the guide surface of the holding board is supported by the hydrostatic bearing member in a state in which the guide surface does not contact the supporting means, and the first and second driving means are indivually supported on the base board, there is no possibility of generating a large amount of oscillation during the driving operation of the first and second driving means. Furthermore, since elastic members, such as leaf springs or the like, are not required, there is no possibility of deforming the guide surface and the holding board even if the amount of driving is large, and thereby causing a decrease in positioning accuracy. In addition, if the first driving means includes at least three driving devices connected to different portions in the circumferential direction of the holding board, the angle of inclination of the holding board with respect to the plane perpendicular to the central axis can be adjusted by changing the amount of driving of each driving device.

The foregoing and other objects, advantages and features of the present invention will become more apparent from the following description of the preferred embodiments taken in conjunction with the accompanying drawings.

DESCRIPTION OF THE PREFERRED EMBODIMENTS

Figure 1:
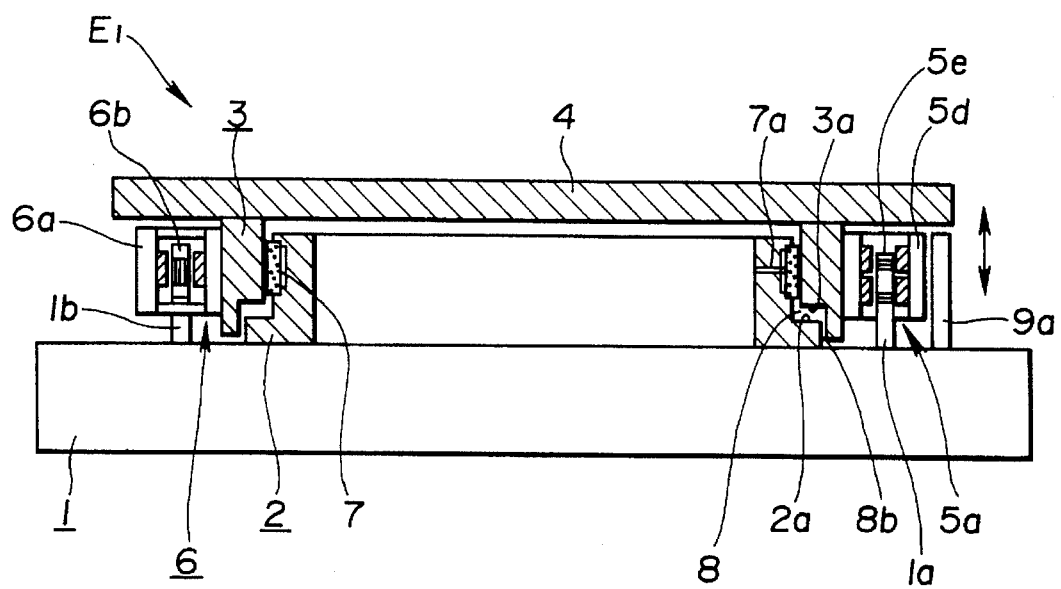
FIG. 1 is a cross-sectional view, as seen from line A–B shown in FIG. 3, of an apparatus according a first embodiment of the present invention.

FIG. 1 is a vertical cross-sectional view illustrating a cross section in the axial direction of an apparatus according to a first embodiment of the present invention. Positioning apparatus $E_1$ of the present embodiment includes a base board 1, serving as a top plate of an X–Y stage of a known projection exposure apparatus, a fixed member 2, serving as cylindrical supporting means provided as one body with base board 1, a cylindrical guide member 3 loosely fitted with the outer circumferential surface of fixed member 2, serving as a supporting surface for guide member 3, a holding board 4 integrally connected to the upper end, as viewed in FIG. 1, of guide member 3, three Z linear motors 5a–5c, serving as first driving means for bringing holding board 4 closer to and away from base board 1, and a θ linear motor 6, serving as second driving means for rotating holding board 4 relative to base board 1. A wafer (not shown) is attracted onto the surface of holding board 4 by a vacuum suction force.

The outer circumferential surface of fixed member 2 and the inner circumferential surface, serving as a guide surface, of guide member 3 are supported in a state such that they do not contact each other, by the hydrostatic pressure of a pressurized fluid ejected from an annular porous pad 7, serving as throttle hydrostatic bearing means, held on the outer circumferential surface of fixed member 2. Hence, holding board 4 is reciprocatable along the central axis of fixed member 2 and guide member 3 (hereinafter termed the "z-axis") and is rotatable around the z axis. Holding board 4 is also able to be inclined with respect to the z axis within a range permitted by the bearing clearance of porous pad 7.

By reducing the size of porous pad 7 in the z-axis direction, the permissible value of the angle of inclination of holding board 4 with respect to the z axis can be increased. Most of the weight of guide member 3, holding board 4 and the wafer attracted thereon is supported by the pressure of a pressurized fluid in a pressure cabin 8, serving as buoyancy means, formed by step 2a provided in fixed member 2 and step 3a provided in guide member 3.

Figure 2:
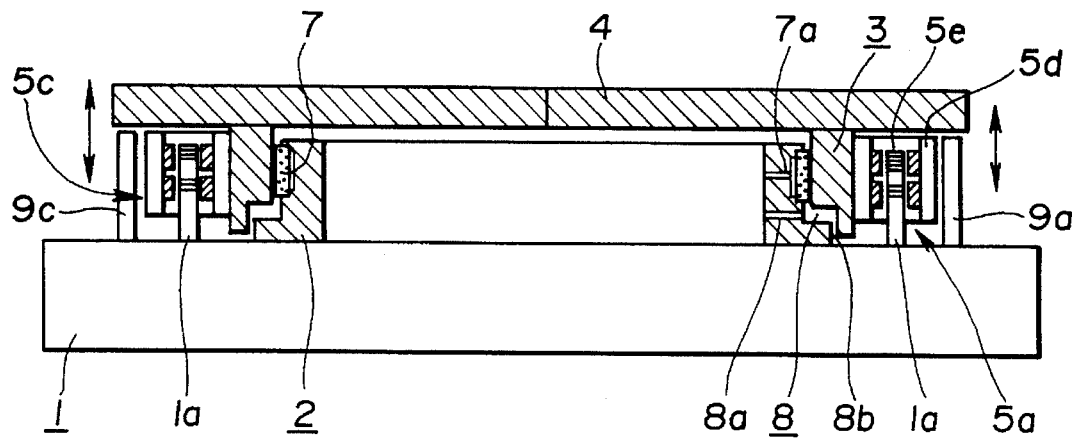
FIG. 2 is a cross-sectional view, as seen from line A–C shown in FIG. 3, of the apparatus of the first embodiment.

As shown in FIG. 2, guide member 3 includes internal channels 7a and 8a for supplying porous pad 7 and pressure cabin 8 with the pressurized fluid, respectively, and a labyrinth seal 8b is formed between the lower end, as viewed in FIGS. 1 and 2, of guide member 3 and fixed member 2. The size of the gap between porous pad 7 and guide member 3 is about 7 μm, and the size of the gap filled by labyrinth seal 8b is about 15 μm.

Z linear motors 5a–5c are disposed with an equal interval in the circumferential direction outside guide member 3. Rotor 5d of each of the Z linear motors 5a–5c has a cylindrical frame having a permanent magnet at its inner surface. The frame is fixed to the outer circumferential surface of guide member 3. Stator 5e of each of the Z linear motors 5a–5c is a coil fixed to supporting member 1a provided as one body with base board 1, and is connected to a predetermined driving circuit by wiring (not shown). Rotor 5d is driven in the z-axis direction in accordance with the amount of current supplied from the driving circuit. If the amount of current supplied to each of the Z linear motors 5a–5c has the same value, holding board 4 moves in the z-axis direction while maintaining its parallelism. By individually changing the amount of current supplied to each of the Z linear motors 5a–5c, the parallelism, i.e., the angle of inclination relative to the z axis, of holding board 4 can be changed.

Figure 3:
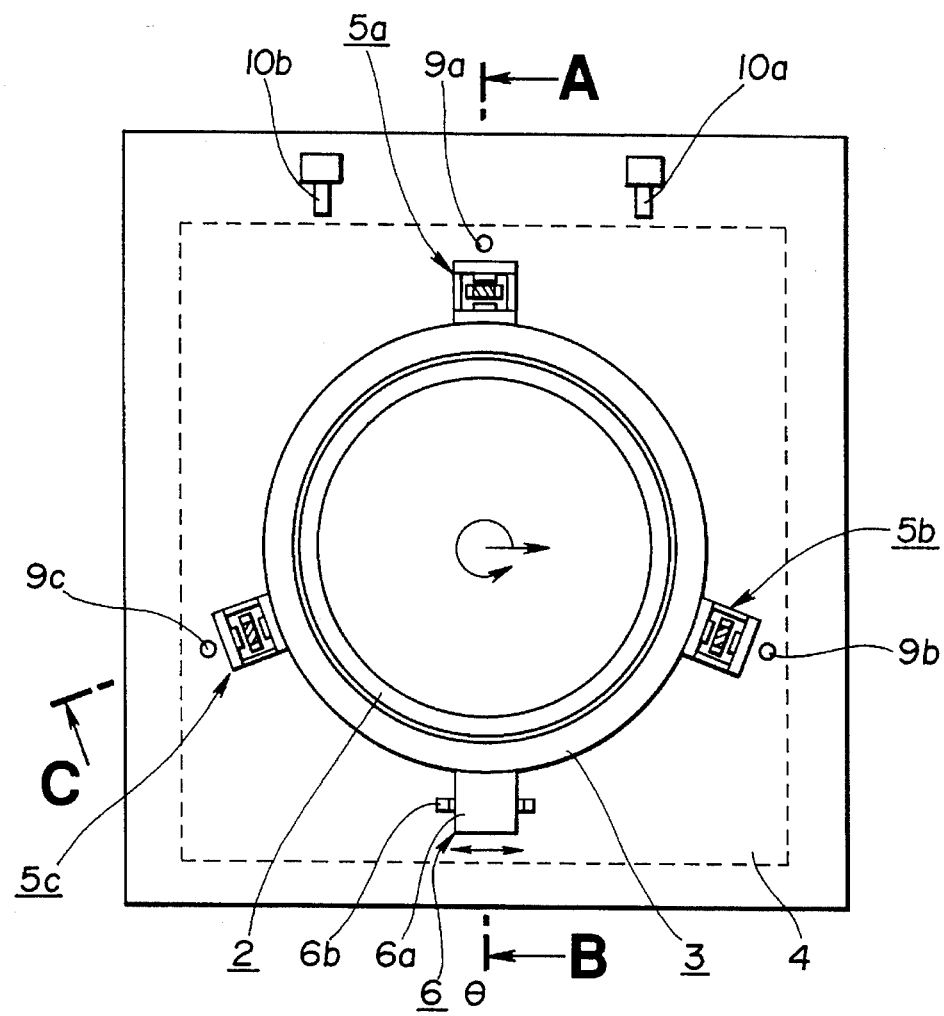
FIG. 3 is a schematic plan view illustrating the apparatus of the first embodiment in a state in which a holding board is removed.

As shown in FIG. 3, θ linear motor 6 is disposed between an arbitrary two of the adjacent motors of the Z linear motors 5a–5c. Rotor 6a of θ linear motor 6 has a cylindrical frame having a permanent magnet at its inner surface. The frame is fixed to the outer circumferential surface of guide member 3. Stator 6b of θ linear motor 6 is a coil fixed to supporting member 1b provided as one body with base board 1, and is connected to a predetermined driving circuit by wiring (not shown). Rotor 6a is driven in the circumferential direction of holding board 4 in accordance with the amount of current supplied from the driving circuit, whereby holding board 4 is rotated around the z-axis.

Base board 1 includes first non-contact-type displacement sensors 9a–9c adjacent to Z linear motors 5a–5c, respectively. Each of the displacement sensors 9a–9c includes a detection end facing the lower surface, as viewed in FIGS. 1 and 2, of holding board 4, and detects a change in the position of holding board 4 in the z-axis direction. Base board 1 also includes a pair of second non-contact-type displacement sensors 10a and 10b facing a side of holding board 4. The angle of rotation of holding board 4 around the z-axis is detected from the difference between the outputs of displacement sensors 10a and 10b. By performing a feedback operation of the outputs of the first displacement sensors 9a–9c and the second displacement sensors 10a and 10b to the above-described driving circuits, fine positioning of holding board 4 can be automatically performed.

In the present embodiment, since Z linear motors 5a–5c and θ linear motor 6 are individually supported on base board 1, and holding board 4 does not contact base board 1, there is no possibility of generating a large amount of oscillation while holding board 4 is moved. Furthermore, since most of the weight of holding board 4 and the wafer held thereon is supported by pressure cabin 8, the driving force of each of the z linear motors 5a–5c and θ linear motor 6 need not be large.

Figure 4:
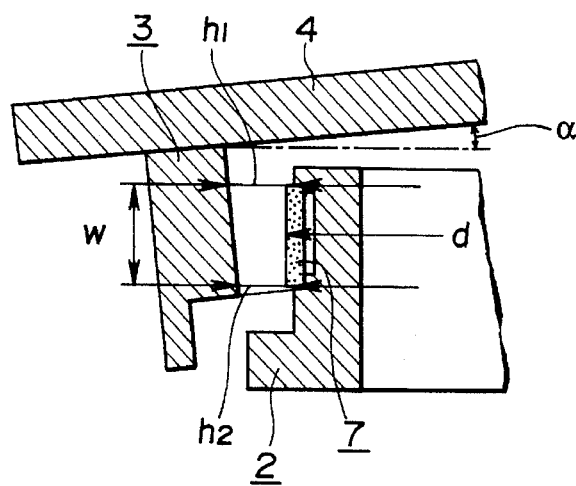
FIG. 4 is an enlarged cross-sectional view illustrating a portion of the apparatus of the first embodiment.

When the parallelism of holding board 4 is changed, that is, the angle of inclination of holding board 4 with respect to the z axis is changed, the size of the bearing clearance of porous pad 7, the size of the gap of labyrinth seal 8a, and the size of the gap between the permanent magnet and the coil of each of the z linear motors 5a–5c and θ linear motor 6 change. However, the amounts of such changes are very small in a positioning apparatus for performing focusing or final positioning of an exposure apparatus. Hence, there is no possibility that porous pad 7 contacts guide member 3, the performance of labyrinth seal 8a greatly decreases, or the amount of driving of each of the linear motors is greatly limited. That is, usually, the minimum gap of a linear motor is about 1–2 mm. For example, as shown in FIG. 4, if the diameter of the bearing surface of porous pad 7 is represented by d, the size of porous pad 7 in the z-axis direction is represented by w, and the sizes of two ends of the bearing clearance are represented by $h_1$ and $h_2$, and if d=200 mm, w=20 mm, and the amount $\propto$ of fine adjustment of the angle of inclination of holding board 4 is $3\times10^{-4}$ rad, the amount of variation of the size of the bearing clearance $(h_1-h_2)/2$ is about 3 μm. However, as described above, since the size of the gap of porous pad 7 is set to 7 μm, and the size of the gap of the labyrinth seal is set to 15 μm, the above-described problem will not arise. The stroke length of the rotor of each linear motor can have a value as large as about 5 mm.

Figure 5:
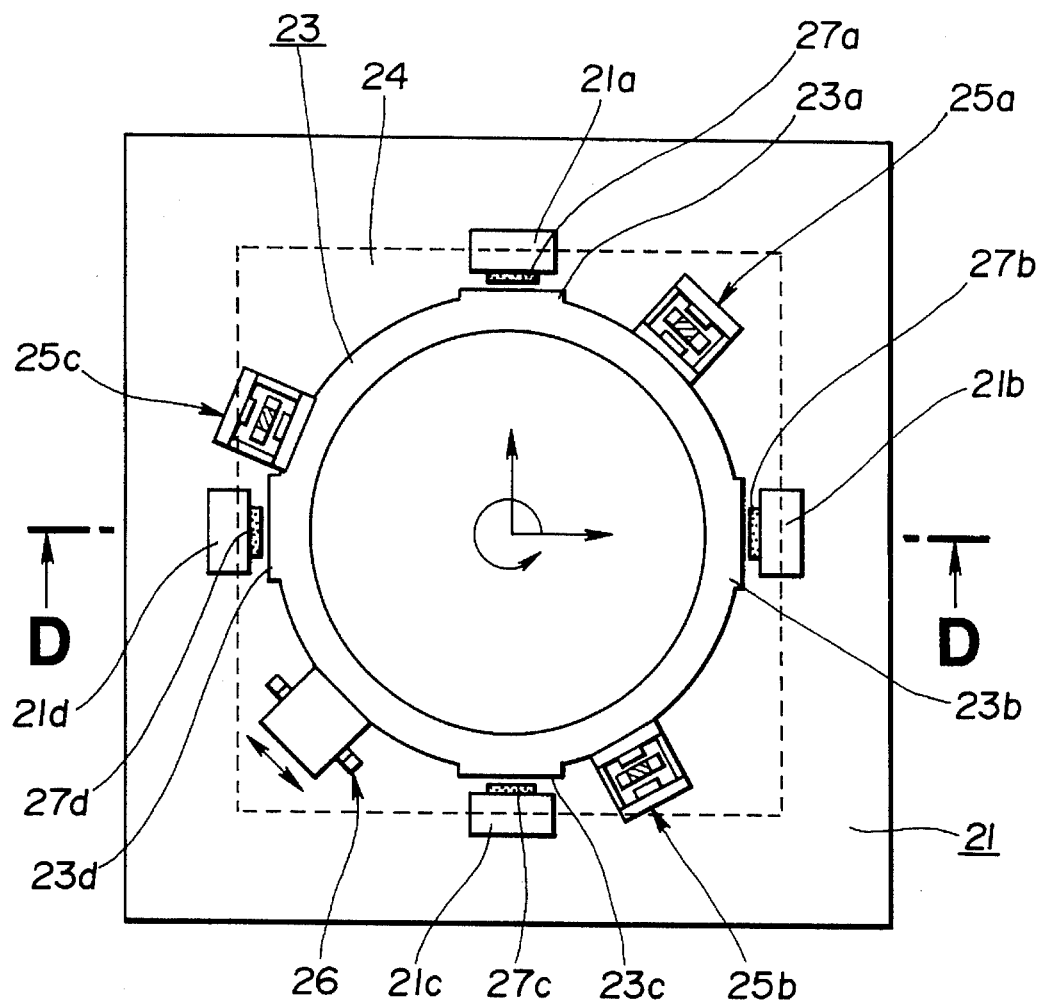
FIG. 5 is a schematic plan view illustrating an apparatus according to a second embodiment of the present invention in a state in which a holding board is removed.
Figure 6:
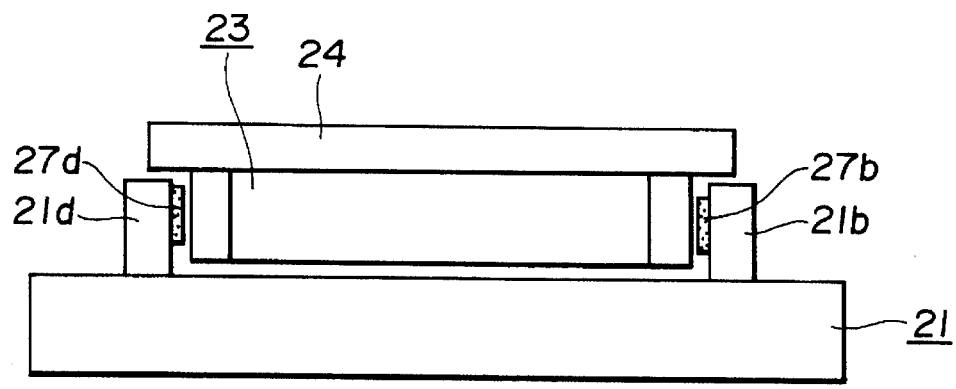
FIG. 6 is a cross-sectional view taken along line D—D shown in FIG. 5.

FIGS. 5 and 6 illustrate a second embodiment of the present invention. In this embodiment, four stands 21a–21d provided as one body with base board 21 are used instead of the cylindrical fixed member 2 of the first embodiment, and porous pads 27a–27d, each comprising a small piece, are held on stands 21a–21d, respectively. Porous pads 27a–27d face flat portions 23a–23d, respectively, provided at the outer circumferential surface of guide member 23, which is provided as one body with holding board 24, and support guide member 23 from four portions in a non-contact state. Z linear motors 25a–25c for moving holding board 24 in the z-axis direction and θ linear motor 26 for rotating base board 24 around the z-axis are the same as those in the first embodiment. Hence, a description thereof will be omitted. In the present embodiment, since the weight of base board 24 and the wafer attracted thereto must be supported only by the driving forces of Z linear motors 25a–25c, the amount of electric power consumption has a larger value than in the first embodiment. On the other hand, the components can be more easily assembled because no pressure cabin is required.

Figure 7:
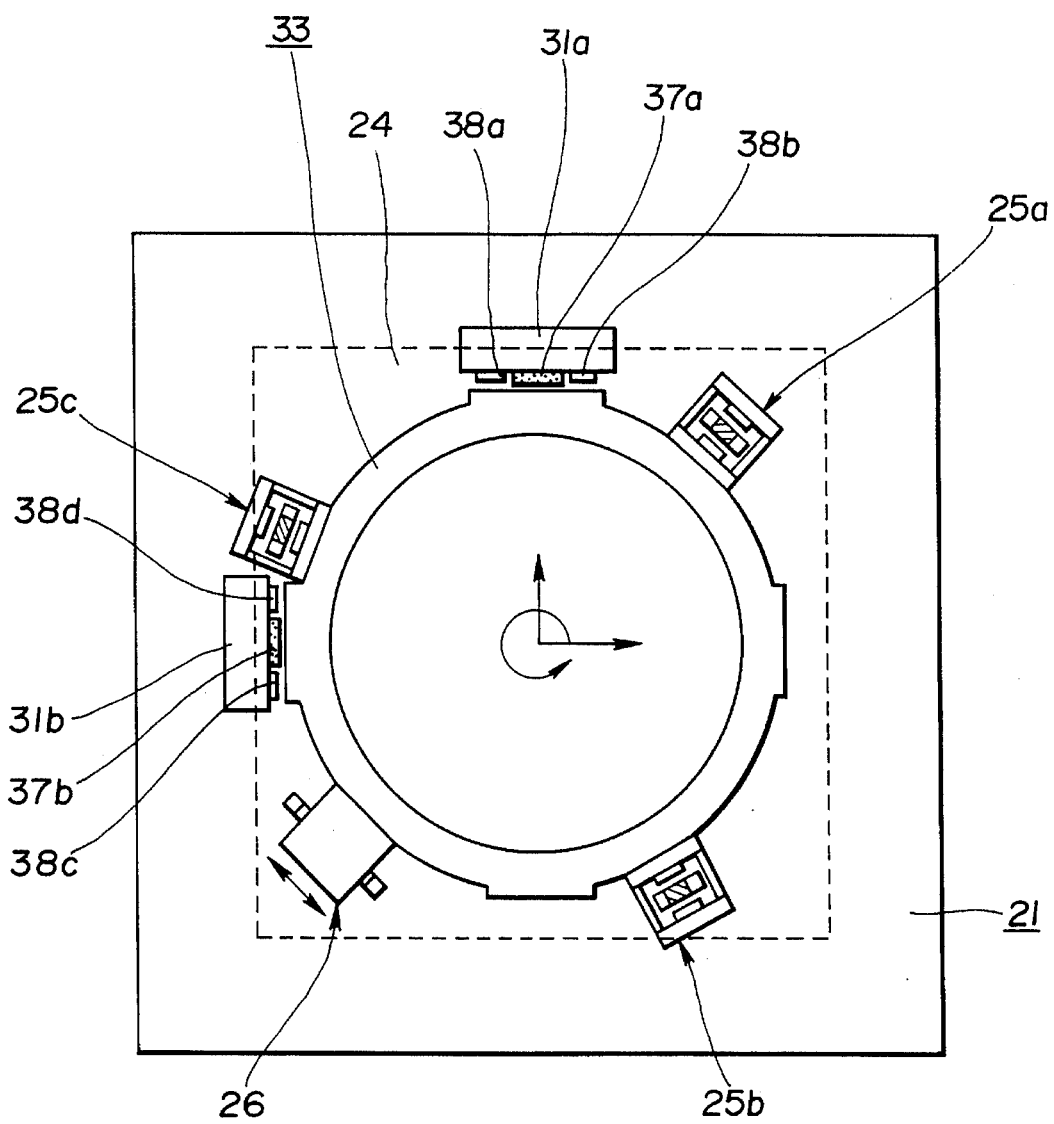
FIG. 7 is a schematic plan view illustrating a modification of the second embodiment in a state in which a holding board is removed.
Figure 8:
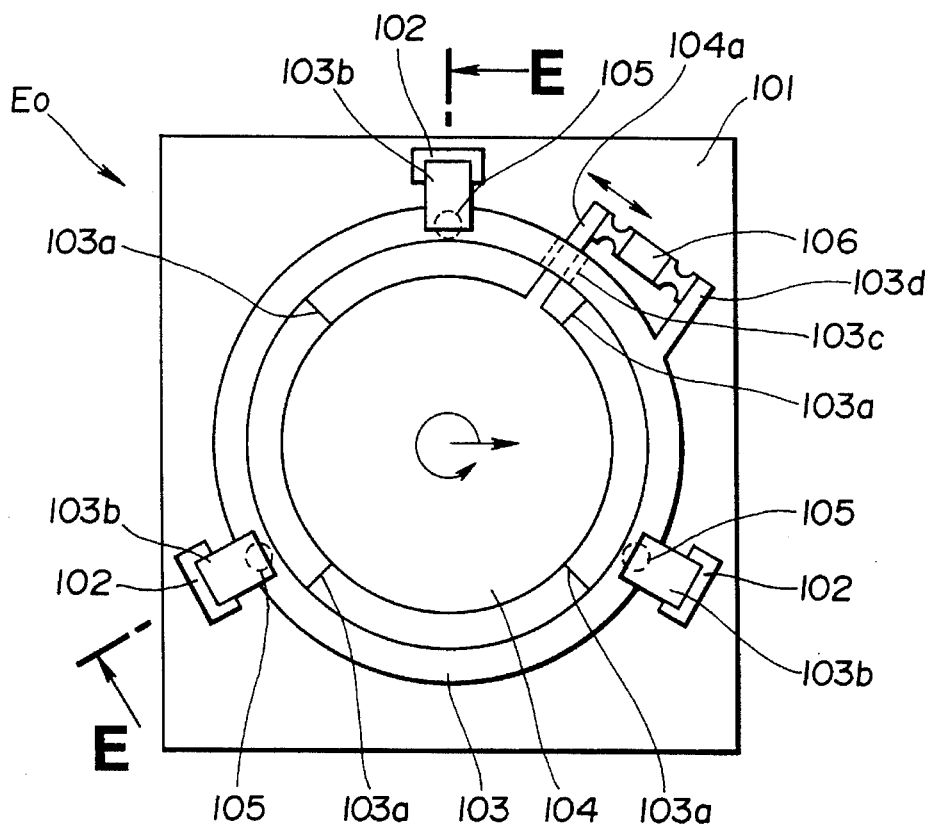
FIG. 8 is a schematic plan view illustrating a conventional apparatus.
Figure 9:
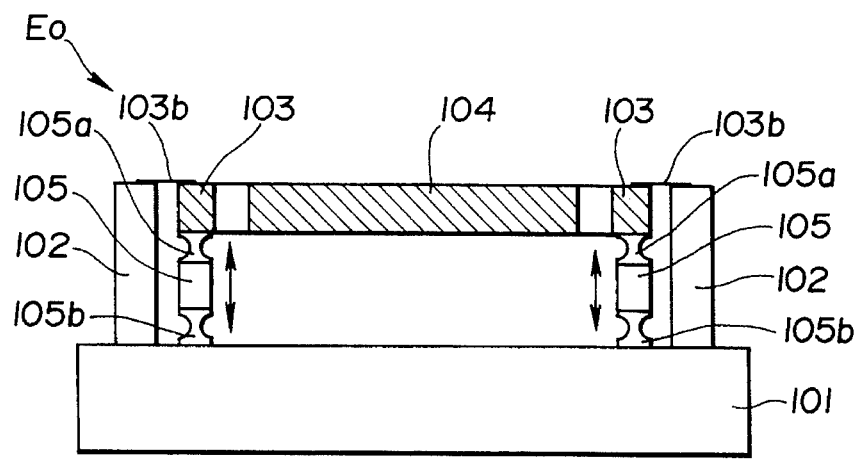
FIG. 9 is a cross-sectional view taken along line E–E shown in FIG. 8.

FIG. 7 illustrates a modification of the second embodiment. In this modification, two stands 31a and 31b facing guide member 33, which is identical to guide member 23, from two directions are provided instead of the four stands 21a–21d in the second embodiment. These stands 31a and 31b hold porous pads 37a and 37b, each comprising a small piece, respectively. Guide member 33 is attracted toward porous pads 37a and 37b by the magnetic attractive force of permanent magnets 38a–38d for pressurization provided adjacent to porous pads 37a and 37b.

In this modification, the number of components is reduced in proportion to the reduced number of stands, and therefore the production cost can be reduced.

Instead of the Z linear motor used in the first and second embodiments a piezoelectric element, or a combination of a rotation motor and a screw or an elastic hinge may be used. Furthermore, instead of the θ linear motor, a rotation motor may be used.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A positioning apparatus comprising:

a base board;

a holding board for holding a substrate;

a fixed member provided as a unit with said base board;

a guide member provided as a unit with said holding board;

hydrostatic bearing means for spacing apart said guide member from said fixed member, said guide member being movable along an axis and rotatable around the axis in relation to said fixed member, and said guide member being capable of being inclined with respect to the axis in a range allowed by a bearing clearance of said hydrostatic bearing means;

first driving means for moving said holding board and said guide member along the axis, said first driving means comprising a plurality of driving devices supported by said base board, each of said driving devices comprising a stator and a rotor., which is apart from the stator, and said holding board and said guide member being inclined by changing a respective driving mount of each of said driving devices; and second driving means for rotating said holding board and said guide member around the axis.

2. A positioning apparatus according to claim 1, wherein said hydrostatic bearing means is arranged between a supporting surface of said fixed member and a guide surface of said guide member, said guide member being cylindrical, and said guide surface comprising one of an inner circumferential surface and an outer circumferential surface of said cylindrical guide member.

3. A positioning apparatus according to claim 1, wherein said hydrostatic bearing means is a porous throttle type.

4. A positioning apparatus according to claim 1, wherein said first driving means comprises at least three driving devices connected to different portions in the circumferential direction of said holding board.

5. A positioning apparatus according to claim 1, wherein said first driving means comprises at least one linear motor.

6. A positioning apparatus according to claim 1, wherein said second driving means comprises a linear motor.

7. A positioning apparatus according to claim 1, wherein said second driving means comprises a rotation motor.

8. A positioning apparatus according to claim 1, further comprising buoyancy means for resiliently supporting said holding board in a predetermined direction.

9. A positioning apparatus according to claim 2, further comprising a pressure cabin, for containing a pressurized fluid, provided between said holding means and said guide member, and wherein said holding board is resiliently supported in a predetermined direction by the pressure of the pressurized fluid sealed in said pressure cabin.

* * * * *

UNITED STATES PATENT AND TRADEMARK OFFICE
CERTIFICATE OF CORRECTION

PATENT NO. : 5,524,502
DATED : June 11, 1996
INVENTOR(S) : EIJI OSANAI

It is certified that error appears in the above-indentified patent and that said Letters Patent is hereby corrected as shown below:

COLUMN 3:

Line 65, "z axis" should read --z-axis--.
    Line 66, "z axis" should read --z-axis--.

COLUMN 4:

Line 3, "z axis" should read --z-axis--.
    Line 33, "z axis" should read --z-axis--.

COLUMN 5:

Line 3, "z linear" should read --Z linear--.
    Line 7, "z axis" should read --z-axis--.
    Line 10, "z linear" should read --Z linear--.
    Line 67, "embodiments" should read --embodiments,--.

COLUMN 6:

Line 32, "rotor.," should read --rotor,--.

Signed and Sealed this

Twenty-ninth Day of October 1996

Attest:

BRUCE LEHMAN

Attesting Officer      Commissioner of Patents and Trademarks